Figure 1:
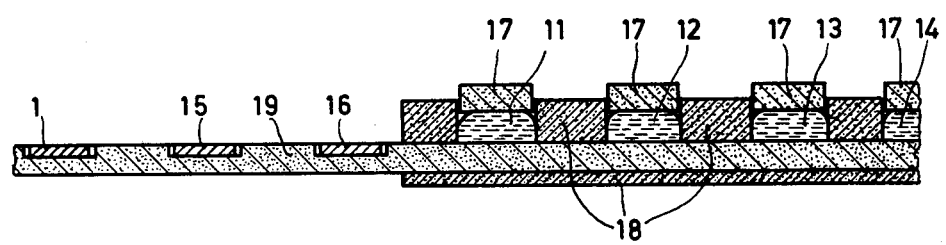

United States Patent [19]

van Oirschot et al.

[11] 4,218,269
[45] Aug. 19, 1980

[54] METHOD FOR THE EPITAXIAL DEPOSITION OF SEVERAL LAYERS

[75] Inventors: Theodorus G. J. van Oirschot; Willem J. Leswin; Petrus J. A. Thijs; Willem Nijman, all of Eindhoven, Netherlands

[73] Assignee: U.S. Philips Corporation, New York, N.Y.

[21] Appl. No.: 951,228

[22] Filed: Oct. 13, 1978

[30] Foreign Application Priority Data

Nov. 9, 1977 [NL] Netherlands .......................... 7712315

[51] Int. Cl.² .......................................... H01L 21/208
[52] U.S. Cl. ...................................... 148/171; 148/172
[58] Field of Search .................................. 148/171, 172

[56] References Cited

U.S. PATENT DOCUMENTS

| | | | |
|---|---|---|---|
| 3,899,371 | 8/1975 | Ladany et al. ........................ | 148/171 |
| 3,963,536 | 6/1976 | Ettenberg et al. .................... | 148/171 |
| 4,088,514 | 5/1978 | Hara et al. ............................ | 148/171 |
| 4,137,107 | 1/1979 | Nijman et al. ........................ | 148/171 |
| 4,149,914 | 4/1979 | Weyrich et al. ...................... | 148/171 |

Primary Examiner—G. Ozaki
Attorney, Agent, or Firm—Thomas A. Briody; Robert T. Mayer; Steven R. Biren

[57] ABSTRACT

A method of manufacturing a semiconductor device having a monocrystalline substrate and a plurality of epitaxial layers successively deposited on the substrate is disclosed. The device is manufactured by successively contacting the substrate with solutions which are previously saturated by contact with a plurality of auxiliary substrates, in a process in which the monocrystalline substrate, the auxiliary substrates and the solutions are cooled before the layers are deposited. The method includes the steps of contacting a first auxiliary substrate with a first solution, contacting a second auxiliary substrate with this first solution while simultaneously contacting the first auxiliary substrate with a second solution, contacting the monocrystalline substrate with the first solution to deposit a first layer thereon while simultaneously contacting a second auxiliary substrate with the second solution, and then contacting the monocrystalline with the second solution to deposit a second layer thereon. The total contact time of each solution with the auxiliary substrates is not limited to the time of a single contact of the monocrystalline substrate with any solution. In this matter, the solubility times for the auxiliary substrates need not be limited to the epitaxial layer growth time of the monocrystalline substrate, thus resulting in an improved and more flexible manufacturing process.

4 Claims, 2 Drawing Figures

METHOD FOR THE EPITAXIAL DEPOSITION OF SEVERAL LAYERS

The invention relates to a method of manufacturing a device comprising a monocrystalline substrate and several epitaxial layers deposited on the substrate, the substrate being successively contacted with solutions which are previously saturated by contact with an auxiliary substrate, the substrate with the solutions and the auxiliary substrate being cooled and the layers being successively deposited, and to a device manufactured by means of the method.

Methods of the kind mentioned above are known from Journal of Crystal Growth 15 81–83 (1972).

In a first known method the substrate and an auxiliary substrate are situated in recesses in a slide which can be moved relative to a holder with solutions so that successively the auxiliary substrate and the substrate are contacted with the various solutions.

The solutions described comprise a deficiency of arsenic with respect to the saturation of gallium as a solvent with gallium arsenide at the growth temperature. The solutions are saturated by contact with the auxiliary substrate consisting of gallium arsenide.

It proves to be difficult to control the thickness of successively deposited, approximately 1 $\mu$m thick layers by means of the said first known method.

If, for example, as is necessary in the manufacture of laser devices, after depositing a very thin active layer of, for example, 0.3 $\mu$m thickness, (layer 3 in FIG. 2) a thicker layer of, for example, 1 $\mu$m thickness (layer 4 in FIG. 2) is to be grown, the time for contact of the solution from which the thicker layer is to be grown with the auxiliary substrate often is insufficient to reach equilibrium. As a matter of fact, the said contact time is the same as the comparatively short contact time of the substrate with the solution from which the thin active layer is to be grown.

The result is that considerable spreading in the thickness of, for example, the thicker layer can occur.

In a second known method a slide is therefore used having only one recess, namely for the substrate, while for the solutions a minimum volume is chosen, each solution being covered with a gallium arsenide auxiliary substrate which serves as a source for gallium arsenide in the solution.

Although in this known method a sufficient adjustment of the saturation state of the solutions seems to be ensured, said method also proves to exhibit great disadvantages due to the occurrence of irregular growth of the epitaxial layers and poor wiping of the solutions.

One of the objects of the invention is to avoid these disadvantages at least to a considerable extent and to reduce the spreading in thickness of the deposited layers. It is based inter alia on the recognition of the fact that a solution to the described problem should be found rather along the route of an improvement in the first described known method.

Therefore, according to the invention, the method described above is characterized in that the epitaxial deposition comprises four phases of which in the first phase of the epitaxial process a first solution is contacted with a first auxiliary substrate, in the second phase the first solution is contacted with a second auxiliary substrate and simultaneously a second solution is contacted with the first auxiliary substrate, in the third phase the first solution is contacted with the substrate and simultaneously the second solution is contacted with the second auxiliary substrate, and in the fourth phase the second solution is contacted with the substrate.

The epitaxial deposition need not be restricted to the above four phases.

The advantages of the method according to the invention become apparent in particular when the layer deposited on the substrate from the first solution is thinner than 0.5 $\mu$m and the layer deposited from the second solution is thinner than 1.5 $\mu$m.

The number of auxiliary substrates used in the method according to the invention may be larger than two, depending on the number of thin layers which are to be grown successively.

In order to avoid the growth of dendrites, to perform the wiping of the solutions as readily as possible, and in general to prevent disturbances of the epitaxial process as much as possible, monocrystalline auxiliary substrates are preferably used.

The method according to the invention can also be carried out in a readily reproducible manner and with few instabilities during the deposition if preferably monocrystalline layers of III–V compounds are deposited from solutions of the III-element which, prior to being contacted with the auxiliary substrates, are oversaturated with the V-element.

The invention furthermore relates to a device, in particular a semiconductor laser device, manufactured by means of the method according to the invention.

The invention will now be described in greater detail with reference to an embodiment and the accompanying drawing.

Figure 2:
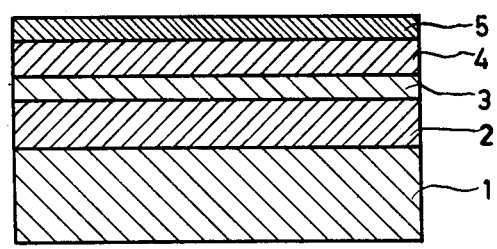

FIG. 1 in the drawing is a diagrammatic sectional view of a part of an apparatus for carrying out the method according to the invention and FIG. 2 is a diagrammatic sectional view of a part of a device manufactured by means of the method according to the invention.

This method relates to the manufacture of a device comprising a monocrystalline substrate 1 (see FIGS. 1 and 2) and several epitaxial layers 2, 3, 4 and 5 deposited on the substrate 1. The substrate 1 is successively contacted with solutions 11, 12, 13 and 14 (shown partly) covered by graphite discs 17.

The said solutions are contained in a graphite holder 18 and are previously saturated by contact with an auxiliary substrate 15.

The substrate 1 with the solutions 11, 12, 13 and 14 and the auxiliary substrate 15 are cooled and the layers 2, 3, 4 and 5 are deposited successively.

According to the invention the epitaxial deposition comprises four phases of which in the first phase a first solution 11 is contacted with a first auxiliary substrate 16 in the first phase.

In the second phase the first solution 11 is contacted with a second auxiliary substrate 15 and simultaneously a second solution 12 is contacted with the first auxiliary substrate 16 in the graphite slide 19.

In the third phase the first solution 11 is contacted with the substrate 1 and simultaneously the second solution 12 is contacted with the second auxiliary substrate 15.

In the fourth phase the second solution 12 is contacted with the substrate 1.

In this manner two epitaxial layers are formed on the substrate 1, of which layers preferably the one deposited on the substrate from the first solution is thinner than 0.5 μm and the layer deposited from the second solution 12 is thinner then 1.5 μm.

Preferably monocrystalline auxiliary substrates are used.

If three or four epitaxial layers are to be deposited by means of the method according to the invention more than two auxiliary substrates may be used. If, as in the present example, three comparatively thin layers are successively deposited, two or three auxiliary substrates may be used, with layer 3 being thinner than 0.5 μm and the layer 4 being thinner than 1.5 μm as shown in FIG. 2.

Of course, for the present example four solutions 11, 12, 13 and 14 are necessary. As a substrate a monocrystalline body which has already been provided with an epitaxial layer may be used.

Monocrystalline layers of III-V compounds, for example gallium arsenide and gallium aluminum arsenide, are preferably deposited from solutions of the III-element, for example gallium, which, before being contacted with the auxiliary substrates, are oversaturated with the V-element, for example arsenic.

By means of the method according to the invention a 3 to 4 μm thick n-type gallium aluminum arsenide layer 2, a 0.3 μm±0.1 μm thick p-type gallium arsenide layer 3, a 1 μm±0.1 μm thick p-type gallium aluminum arsenide layer 4 and a 0.4 μm thick $P^{30}$-type gallium arsenide layer 5 may successively be deposited on an n-type gallium arsenide substrate 1 so as to obtain a semiconductor laser device.

The required four solutions 11, 12, 13 and 14 are made in a usual manner. Auxiliary substrates 15 and 16 consist of monocrystalline gallium arsenide.

If only one auxiliary substrate 15 is used, for example, 20 minutes, 20 seconds, 2 to 3 minutes and 1 minute, respectively, are necessary for the growth of the layers 2, 3, 4 and 5 in a conventional temperature range. If two auxiliary substrates 15 and 16 are used, 20 minutes, 20 seconds, 10 minutes and 2 minutes, respectively, are necessary in the same temperature range.

In the case of one auxiliary substrate, a time of 20 seconds is insufficient for solution 13 to reach equilibrium, so that layer 4 from an oversaturated solution grows rapidly and in a poorly reproducible manner. This problem is considerably reduced when two auxiliary substrates are used. The growth of the layer 5 when two auxiliary substrates are used also occurs in a more reproducible manner.

In the active layer 3 a region is defined in the usual manner in which laser radiation is generated. This is carried out, for example, by masking with narrow tracks of gold followed by a proton bombardment or by insulation with silicon oxide tracks, after which usual process steps are carried out to obtain a laser device. It will be obvious that the invention is not restricted to the example described but that many variations are possible to those skilled in the art without departing from the scope of the invention.

What is claimed is:

1. A method of manufacturing a semiconductor device having a monocrystalline substrate and a plurality of epitaxial layers successively deposited on the substrate by successively contacting the substrate with solutions which are previously saturated by contact with a plurality of auxiliary substrates, in which the monocrystalline substrate, the auxiliary substrates and the solutions are cooled before the layers are deposited, which comprises:

contacting a first auxiliary substrate with a first solution;

contacting a second auxiliary substrate with said first solution while simultaneously contacting the first auxiliary substrate with a second solution;

contacting the monocrystalline substrate with said first solution to deposit a first layer thereon while simultaneously contacting said second auxiliary substrate with said second solution; and then contacting the monocrystalline substrate with said second solution to deposit a second layer thereon, the total contact time of each said solution with said auxiliary substrates not being limited to the time of a single contact of said monocrystalline substrate with any solution.

2. A method as claimed in claim 1 wherein the layer deposited on the substrate from the first solution is thinner than 0.5 μm and the layer deposited from the second solution is thinner than 1.5 μm.

3. A method as claimed in claim 1 wherein monocrystalline auxiliary substrates are used.

4. A method as claimed in claim 1, wherein monocrystalline layers of III-V compounds are deposited from solutions of the III-element which, prior to being contacted with the auxiliary substrates, are oversaturated with the V-element.

* * * * *